United States Patent
Kao et al.

(10) Patent No.: US 11,309,857 B2
(45) Date of Patent: Apr. 19, 2022

(54) AUDIO PLAYBACK DEVICE AND METHOD

(71) Applicant: Realtek Semiconductor Corporation, Hsinchu (TW)

(72) Inventors: Li-Lung Kao, New Taipei (TW); Chia-Chi Tsai, Zhubei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 34 days.

(21) Appl. No.: 16/874,821

(22) Filed: May 15, 2020

(65) Prior Publication Data

US 2020/0366261 A1 Nov. 19, 2020

(30) Foreign Application Priority Data

May 16, 2019 (TW) ................................ 108116966

(51) Int. Cl.
*H03F 3/183* (2006.01)
*H03G 3/30* (2006.01)

(52) U.S. Cl.
CPC ........... *H03G 3/3005* (2013.01); *H03F 3/183* (2013.01); *H03G 2201/103* (2013.01)

(58) Field of Classification Search
CPC ................ H03F 2200/03; H03F 3/183; H03G 2201/103; H03G 3/3005
USPC .............................................. 381/7, 22, 107
See application file for complete search history.

(56) References Cited

U.S. PATENT DOCUMENTS

| | | | |
|---|---|---|---|
| 2005/0052301 A1* | 3/2005 | Mills | H03M 1/0643 341/144 |
| 2017/0019122 A1* | 1/2017 | Onishi | H03M 3/51 |
| 2018/0367921 A1* | 12/2018 | Murarka | H04R 19/005 |

FOREIGN PATENT DOCUMENTS

CN 205986830 U 2/2017

OTHER PUBLICATIONS

China Office Action, The office action of the corresponding Chinese application No. 201910433849.0 dated Apr. 26, 2021.

* cited by examiner

*Primary Examiner* — Paul Kim
*Assistant Examiner* — Friedrich Fahnert
(74) *Attorney, Agent, or Firm* — Locke Lord LLP; Tim Tingkang Xia, Esq.

(57) ABSTRACT

A device is provided that includes a plurality of signal processing paths coupled in parallel, an adding circuit and an amplifier circuit. The number of the signal processing paths is N and each of the signal processing paths receives a same input signal to generate an output analog signal after a signal processing is performed, wherein each of the signal processing paths at least includes a DAC circuit and the signal processing at least includes a digital to analog conversion corresponding to the DAC circuit. The adding circuit adds the output analog signal generated from each of the signal processing paths to generate a total output analog signal. The amplifier circuit receives the total output analog signal to adjust a signal intensity of the total output analog signal according to a gain to generate an output audio signal, wherein the gain is 1/N.

12 Claims, 5 Drawing Sheets

AUDIO PLAYBACK DEVICE AND METHOD

RELATED APPLICATIONS

This application claims priority to Taiwan Application Serial Number 108116966, filed May 16, 2019, which is herein incorporated by reference.

BACKGROUND

Field of Disclosure

The present disclosure relates to an audio playback technology. More particularly, the present disclosure relates to an audio playback device and an audio playback method.

Description of Related Art

In recent years, users of electronic products pursue better quality of music playing such that the specification of the components for playing music is required to have a higher standard. In current music playing technology, signal processing is first performed on a digital audio signal, e.g. digital to analog conversion, for it to be in an analog form that can be playback by an earphone or an amplifier. However, during such signal processing, noise generated by the circuit in performing the signal processing is transmitted, along with the audio signal, to the earphone or the amplifier, affecting the quality of playback.

Accordingly, what is needed is an audio playback device and an audio playback method to address the above issues.

SUMMARY

An aspect of the present disclosure is to provide an audio playback device that includes a plurality of signal processing paths, an adding circuit and an amplifier circuit. The signal processing paths are coupled in parallel, wherein the number of the signal processing paths is N and each of the signal processing paths is configured to receive a same input signal to generate an output analog signal after a signal processing is performed, wherein each of the signal processing paths at least comprises a digital to analog converting (DAC) circuit and the signal processing at least includes a digital to analog conversion performed by the DAC circuit. The adding circuit is configured to add the output analog signal generated from each of the signal processing paths to generate a total output analog signal. The amplifier circuit is configured to receive the total output analog signal to adjust a signal intensity of the total output analog signal according to a gain to generate an output audio signal, wherein the gain is 1/N.

Another aspect of the present disclosure is to provide an audio playback method that includes the steps outlined below. A same input signal is received by each of a plurality of signal processing paths coupled in parallel to generate an output analog signal after a signal processing is performed, wherein the number of the signal processing paths is N and each of the signal processing paths at least comprises a digital to analog converting (DAC) circuit and the signal processing at least comprises a digital to analog conversion performed by the DAC circuit. The output analog signal generated from each of the signal processing paths is added by an adding circuit to generate a total output analog signal. The total output analog signal is received by an amplifier circuit to adjust a signal intensity of the total output analog signal according to a gain to generate an output audio signal, wherein the gain is 1/N.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
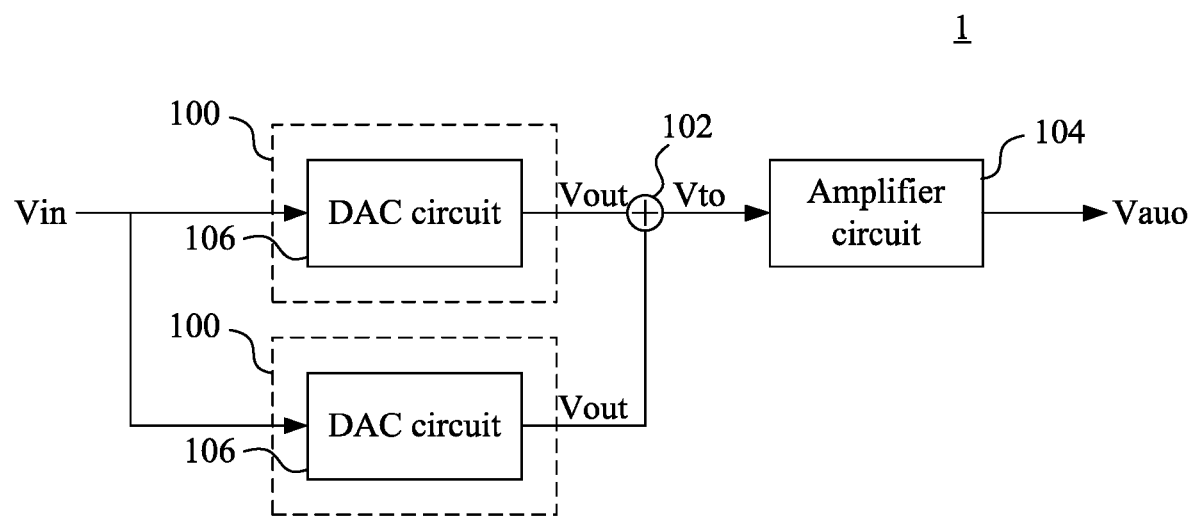
FIG. 1 is a block diagram of an audio playback device in an embodiment of the present invention.

Reference will now be made in detail to the present embodiments of the disclosure, examples of which are illustrated in the accompanying drawings. Wherever possible, the same reference numbers are used in the drawings and the description to refer to the same or like parts.

Reference is now made to FIG. 1. FIG. 1 is a block diagram of an audio playback device 1 in an embodiment of the present invention. In different embodiments, the audio playback device 1 can be an earphone or an amplifier. The audio playback device 1 includes a plurality of signal processing paths 100 connected in parallel, an adder 102 and an amplifier circuit 104.

The number of the signal processing paths 100 is N. In the present embodiment, N is 2. Each of the signal processing paths 100 is configured to receive a same input signal Vin to generate an output analog signal Vout after a signal processing is performed.

In the present embodiment, each of the signal processing paths 100 at least includes a digital to analog converting (DAC) circuit 106. As a result, the signal processing performed by each of the signal processing paths 100 at least includes a digital to analog conversion performed by the DAC circuit 106 to convert the input signal Vin from a digital form to the analog form of the output analog signal Vout.

The adder 102 is configured to add the output analog signal Vout generated from each of the signal processing paths 100 to generate a total output analog signal Vto.

The amplifier circuit 104 is configured to receive the total output analog signal Vto to adjust a signal intensity of the total output analog signal Vto according to a gain to generate an output audio signal Vauo, wherein the gain is 1/N. As a result, the signal intensity of the output audio signal Vauo is actually the same as the signal intensity of the input signal Vin.

As described above, N is 2 in the present embodiment. As a result, the gain is ½.

In an embodiment, the DAC circuit 106 forces the output analog signal Vout to have output noise. In an embodiment, such output noise is Vn,dac. The output noise Vn,dac is presented in the output audio signal Vauo after the processing of the adder 102 and the amplifier circuit 104. In an embodiment, after the adjustment of the gain processed by the amplifier circuit 104, the output noise becomes Vn,dac/N corresponding to the DAC circuit 106 in each of the signal processing paths 100.

Furthermore, since the power of the output noise outputted by the amplifier circuit 104 is $(V_{n,dac}/N)^2$, the total power of N output noises is $N \times (V_{n,dac}/N)^2$. As a result, the total amount of the output noise that is outputted in the output audio signal Vauo generated by the amplifier circuit 104 is $\sqrt{N \times (V_{n,dac}/N)^2}$. Such a total output noise is $(1/(\sqrt{N \times (1/N^2)}))$ times of the output noise from the DAC circuit 106.

As describe above, N is 2 in the present embodiment. As a result, the total output noise is $(1/(\sqrt{2 \times (1/2^2)})) = 1/\sqrt{2}$ times of the output noise. The audio playback device 1 of the present invention can accomplish the object of decreasing the output noise from the signal processing paths 100 by connecting the signal processing paths 100 in parallel and in front of the amplifier circuit 104 to receive the same input signal Vin such that the input signal Vin are processed by the signal processing paths 100 separately, added by the adder 102 and adjusted by the amplifier circuit 104 with the gain.

Figure 2:
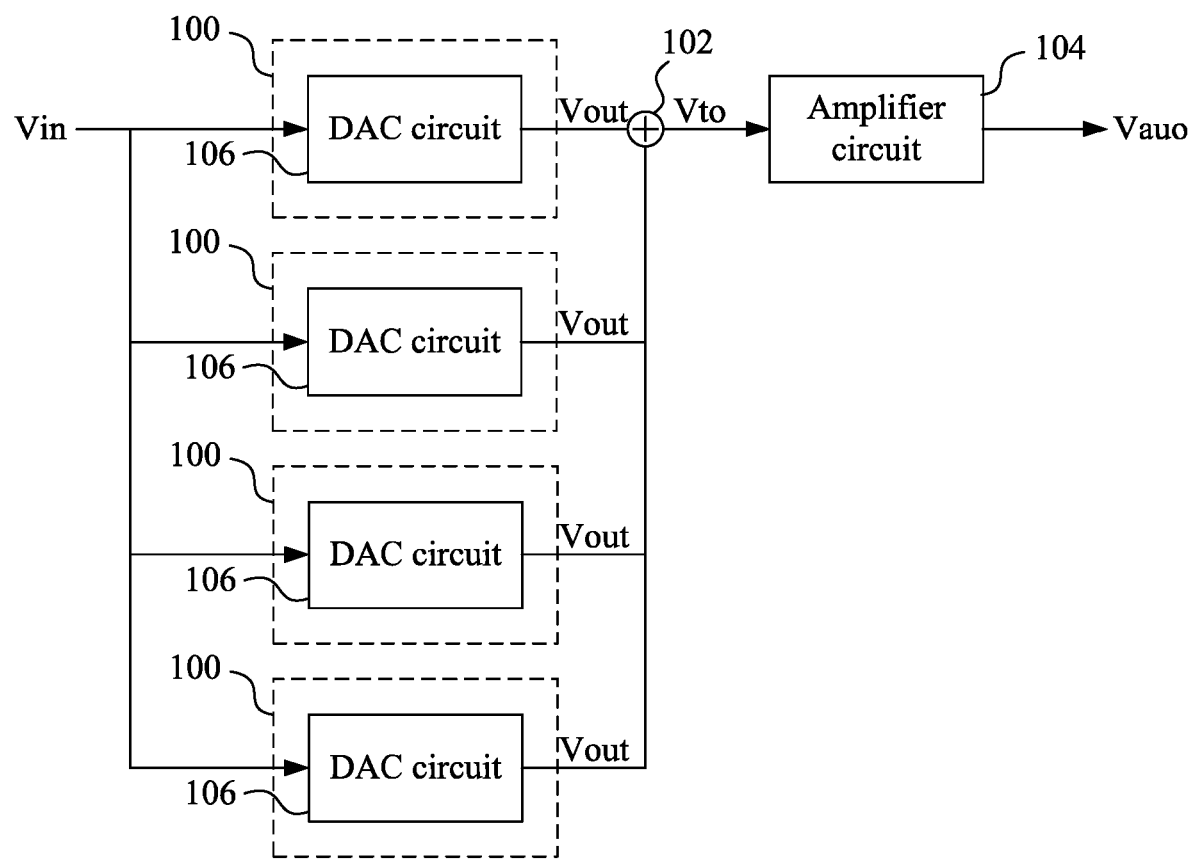
FIG. 2 is a block diagram of an audio playback device in an embodiment of the present invention.

Reference is now made to FIG. 2. FIG. 2 is a block diagram of an audio playback device 2 in an embodiment of the present invention. The audio playback device 2 includes the plurality of signal processing paths 100 connected in parallel, the adder 102 and the amplifier circuit 104. Each of the signal processing paths 100 includes a DAC circuit 106.

The configuration of the signal processing paths 100 connected in parallel, the adder 102 and the amplifier circuit 104 are identical to those in FIG. 1. The detail of these elements is thus not described herein. In the present embodiment, the number of the signal processing paths 100 is 4. As a result, the total output noise outputted by the output audio signal Vauo is $\sqrt{4 \times (1/4^2)} = 1/2$ times of the output noise from the output analog signal Vout.

As a result, when the number N of the signal processing paths 100 becomes larger, the suppression on the noise becomes more significant. However, it is appreciated that when the number N of the signal processing paths 100 becomes larger, the disposition and area cost of the circuit become larger as well. As a result, in different embodiments, an appropriate number of the signal processing paths 100 can be disposed in the audio playback device 2 depending on practical requirements to balance the efficiency of the noise suppression and the circuit cost.

It is appreciated that in the above embodiments, the conditions that N is 2 and 4 are used as an example. In other embodiments, other numbers of the signal processing paths 100 can be used in the audio playback device. The present invention is not limited thereto.

Figure 3:
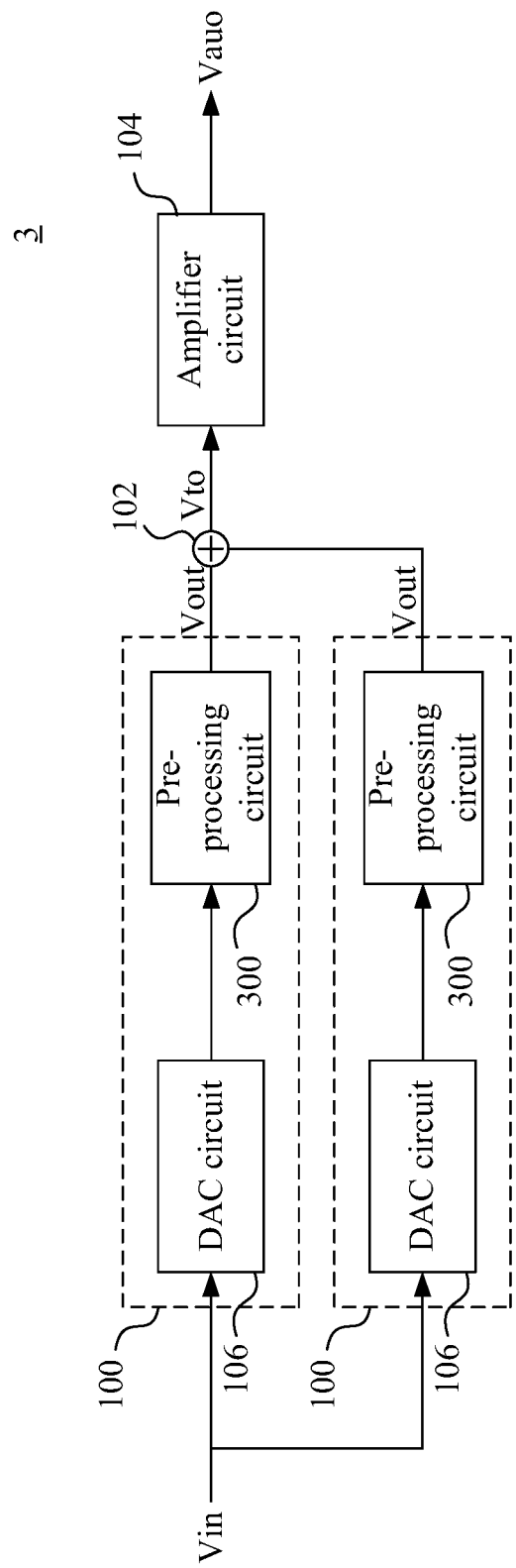
FIG. 3 is a block diagram of an audio playback device in an embodiment of the present invention.

Reference is now made to FIG. 3. FIG. 3 is a block diagram of an audio playback device 3 in an embodiment of the present invention. The audio playback device 3 includes a plurality of signal processing paths 100 connected in parallel, an adder 102 and an amplifier circuit 104.

The configuration of the adder 102 and the amplifier circuit 104 are identical to those in FIG. 1. The detail of these elements is thus not described herein.

In the present embodiment, besides the DAC circuit 106, each of the signal processing paths 100 further includes a pre-processing circuit 300 electrically coupled behind the DAC circuit 106. As a result, the signal processing performed by each of the signal processing paths 100 further includes a signal amplification performed by the pre-processing circuit 300. More specifically, after each of the signal processing paths 100 performs the digital to analog conversion on the input signal Vin, the signal processing including the signal amplification and the signal filtering are performed to generate the output analog signal Vout. In an embodiment, each of the signal processing paths 100 includes a plurality of pre-processing circuits 300 connected in parallel to decrease the noise.

In an embodiment, the amplifier circuit 104 is a post-amplifier circuit or a post-driving circuit, in which the pre-processing circuit 300 is a pre-amplifier circuit or a pre-driving circuit.

In an embodiment, when each of the signal processing paths 100 includes the pre-processing circuit 300 and the signal is processed by the pre-processing circuit 300, the output noise is generated corresponding to the process of the pre-processing circuit 300. As a result, similar to the configuration described above, the object of decreasing the output noise from the signal processing paths 100 can be accomplished by connecting the signal processing paths 100 each including the DAC circuit 106 and the pre-processing circuit 300 in parallel such that the input signal Vin are processed by the signal processing paths 100 separately, added by the adder 102 and adjusted by the amplifier circuit 104 with the gain.

Figure 4:
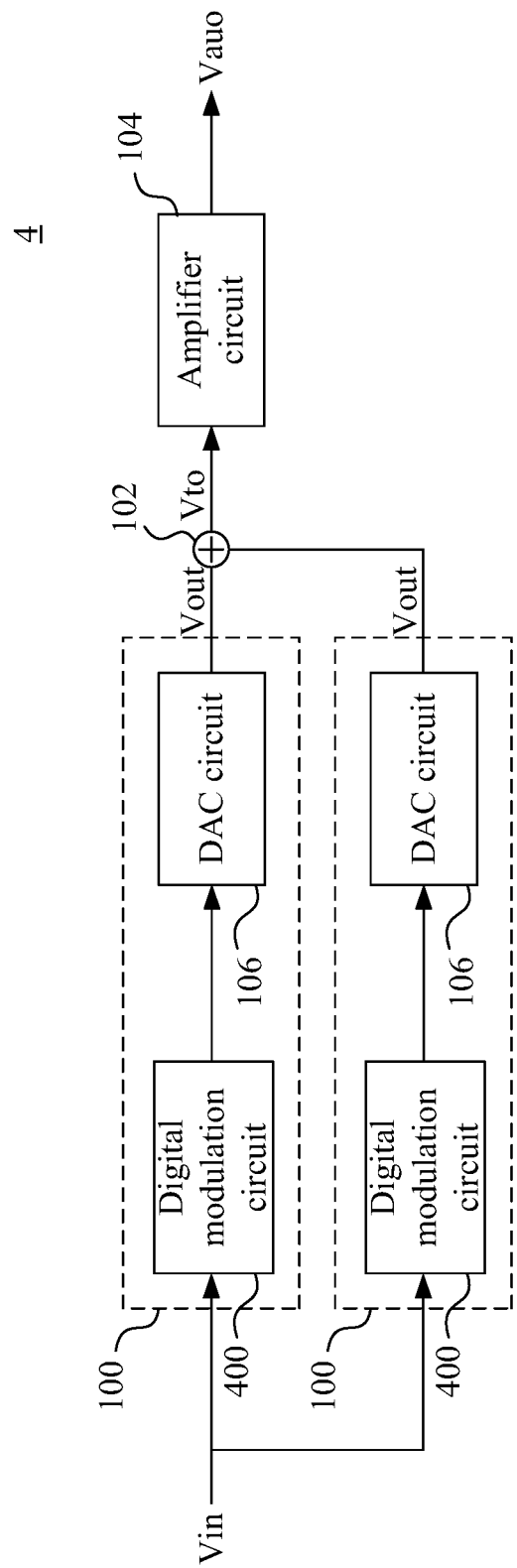
FIG. 4 is a block diagram of an audio playback device in an embodiment of the present invention.

Reference is now made to FIG. 4. FIG. 4 is a block diagram of an audio playback device 4 in an embodiment of the present invention. The audio playback device 4 includes the plurality of signal processing paths 100 connected in parallel, the adder 102 and the amplifier circuit 104. Each of the signal processing paths 100 includes a DAC circuit 106.

The configuration of the signal processing paths 100 connected in parallel, the adder 102 and the amplifier circuit 104 are identical to those in FIG. 1. The detail of these elements is thus not described herein.

In the present embodiment, besides the DAC circuit 106, each of the signal processing paths 100 further includes a digital modulation circuit 400 electrically coupled in front of the DAC circuit 106. As a result, the signal processing performed by each of the signal processing paths 100 includes a signal modulation process performed by the digital modulation circuit 400. More specifically, each of the signal processing paths 100 modulates the input signal Vin first and performs digital to analog conversion subsequently to generate the output analog signal Vout.

In an embodiment, when each of the signal processing paths 100 includes the digital modulation circuit 400 and the signal is processed by the digital modulation circuit 400, the output noise is generated corresponding to the process of the digital modulation circuit 400. As a result, similar to the configuration described above, the object of decreasing the output noise from the signal processing paths 100 can be accomplished by connecting the signal processing paths 100 each including the digital modulation circuit 400 and the DAC circuit 106 in parallel such that the input signal Vin are processed by the signal processing paths 100 separately, added by the adder 102 and adjusted by the amplifier circuit 104 with the gain.

It is appreciated that in the above embodiments in FIG. 3 and FIG. 4, the condition that N is 2 is used as an example. In other embodiments, other numbers of the signal processing paths 100 can be applied in the audio playback device. The present invention is not limited thereto.

Figure 5:
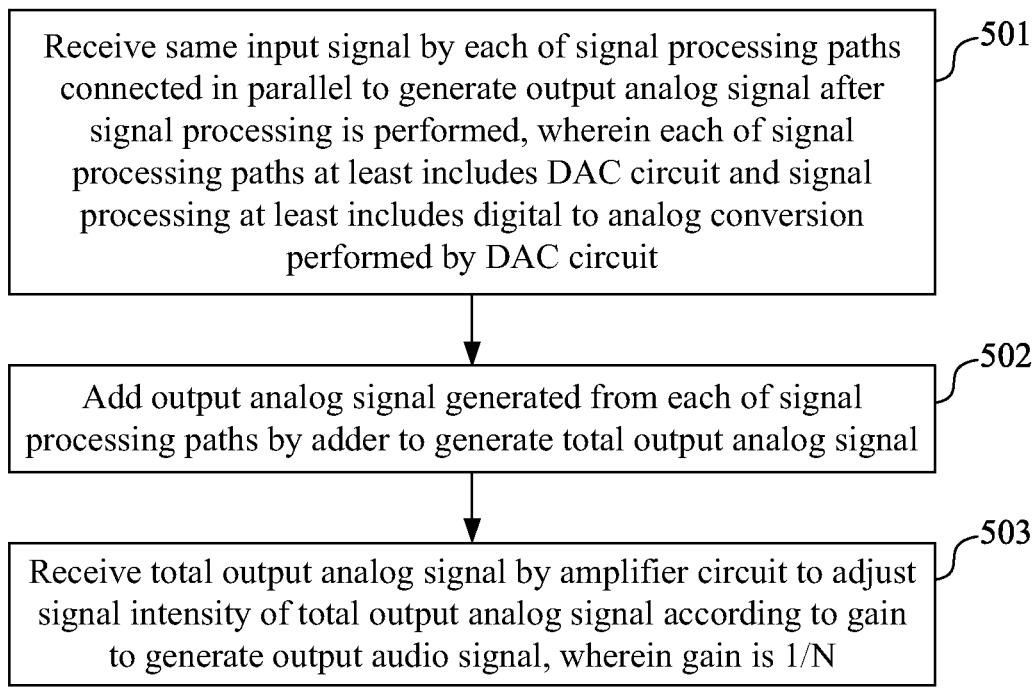
FIG. 5 is a flow chart of an audio playback method in an embodiment of the present invention.

Reference is now made to FIG. 5. FIG. 5 is a flow chart of an audio playback method 500 in an embodiment of the present invention. The audio playback method 500 can be used in such as the audio playback device 1 illustrated in FIG. 1. The audio playback method 500 includes the steps outlined below (The steps are not recited in the sequence in which the steps are performed. That is, unless the sequence of the steps is expressly indicated, the sequence of the steps is interchangeable, and all or part of the steps may be simultaneously, partially simultaneously, or sequentially performed).

In step 501, the same input signal Vin is received by each of the signal processing paths 100 connected in parallel to generate the output analog signal Vout after a signal processing is performed, wherein each of the signal processing paths 100 at least includes the DAC circuit 106 and the signal processing at least includes the digital to analog conversion performed by the DAC circuit 106.

In step 502, the output analog signal Vout generated from each of the signal processing paths 100 is added by the adder 102 to generate the total output analog signal Vto.

In step 503, the total output analog signal Vto is received by the amplifier circuit 104 to adjust the signal intensity of the total output analog signal Vto according to the gain to generate the output audio signal Vauo, wherein the gain is 1/N.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A device, comprising:
    a plurality of signal processing paths coupled in parallel, the number of the signal processing paths being N and each of the signal processing paths being configured to receive a same input signal to generate an output analog signal after a signal processing is performed, each of the signal processing paths at least including a digital to analog converting (DAC) circuit and the signal processing at least includes a digital to analog conversion performed by the DAC circuit;
    an adding circuit configured to add the output analog signal generated from each of the signal processing paths to generate a total output analog signal; and
    an amplifier circuit configured to receive the total output analog signal for adjusting a signal intensity of the total output analog signal according to a gain for generating an output audio signal, the gain being 1/N.

2. The device of claim 1, wherein each of the signal processing paths forces the output analog signal to have an output noise, and a total output noise of the output audio signal generated by the amplifier circuit is $\sqrt{N \times (1/N^2)}$ times of the output noise.

3. The device of claim 1, wherein each of the signal processing paths further comprises a pre-processing circuit electrically coupled behind the DAC circuit, and the signal processing further comprises a signal amplification performed by the pre-processing circuit.

4. The device of claim 3, wherein the amplifier circuit is a post-amplifier circuit or a post-driving circuit.

5. The device of claim 3, wherein the pre-processing circuit is a pre-amplifier circuit or a pre-driving circuit.

6. The device of claim 1, wherein each of the signal processing paths further comprises a digital modulation circuit electrically coupled in front of the DAC circuit, and the signal processing comprises a signal modulation process performed by the digital modulation circuit.

7. An audio playback method, comprising:
    receiving a same input signal by each of a plurality of signal processing paths coupled in parallel to generate an output analog signal after a signal processing is performed, wherein the number of the signal processing paths is N and each of the signal processing paths at least comprises a digital to analog converting (DAC) circuit and the signal processing at least comprises a digital to analog conversion performed by the DAC circuit;
    adding the output analog signal generated from each of the signal processing paths by an adding circuit to generate a total output analog signal; and
    receiving the total output analog signal by an amplifier circuit to adjust a signal intensity of the total output analog signal according to a gain to generate an output audio signal, wherein the gain is 1/N.

8. The audio playback method of claim 7, wherein each of the signal processing paths forces the output analog signal to have an output noise, and a total output noise of the output audio signal generated by the amplifier circuit is $\sqrt{N \times (1/N^2)}$ times of the output noise.

9. The audio playback method of claim 7, wherein each of the signal processing paths further comprises a pre-processing circuit electrically coupled behind the DAC circuit, and the signal processing further comprises a signal amplification performed by the pre-processing circuit.

10. The audio playback method of claim 9, wherein the amplifier circuit is a post-amplifier circuit or a post-driving circuit.

11. The audio playback method of claim 9, wherein the pre-processing circuit is a pre-amplifier circuit or a pre-driving circuit.

12. The audio playback method of claim 7, wherein each of the signal processing paths further comprises a digital modulation circuit electrically coupled in front of the DAC circuit, and the signal processing comprises a signal modulation process performed by the digital modulation circuit.

* * * * *